United States Patent [19]

Partridge

[11] 4,262,297

[45] Apr. 14, 1981

[54] SEMICONDUCTOR CHARGE TRANSFER DEVICE WITH MULTI-LEVEL POLYSILICON ELECTRODE AND BUS-LINE STRUCTURE

[75] Inventor: Susan L. Partridge, Stanmore, England

[73] Assignee: The General Electric Company Limited, London, England

[21] Appl. No.: 98,851

[22] Filed: Nov. 30, 1979

[30] Foreign Application Priority Data

Dec. 19, 1978 [GB] United Kingdom ............... 49053/78

[51] Int. Cl.³ ..................... H01L 29/78; H01L 29/04; G11C 19/28
[52] U.S. Cl. ........................................ 357/24; 357/59; 307/221 D
[58] Field of Search ................ 357/24, 59; 307/221 D

[56] References Cited

U.S. PATENT DOCUMENTS

| 3,943,543 | 3/1976 | Caywood | 357/24 |
| 3,961,352 | 6/1976 | Colton et al. | 357/24 |
| 4,163,239 | 7/1979 | Carter | 357/24 |

Primary Examiner—Gene M. Munson
Attorney, Agent, or Firm—Kirschstein, Kirschstein, Ottinger & Cobrin

[57] ABSTRACT

A semiconductor charge transfer device, e.g. a CCD area imaging array, having a multi-level polysilicon gate structure (20–22, 24, 25, 26) the geometry of the bus-line portions (24, 25, 26) of which are such that each bus-line has relatively large area regions where it does not overlap another polysilicon layer. The making of interconnections (24b, 25b, 26b) between the polysilicon bus-lines and an overlying metal conductor pattern (24a, 25a, 26a) without producing inter-level short circuits via pinholes in the polysilicon is thus facilitated.

7 Claims, 8 Drawing Figures

FIG. 4(a).
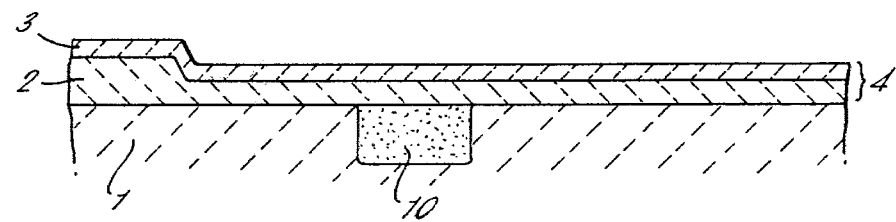
FIG. 4(b).
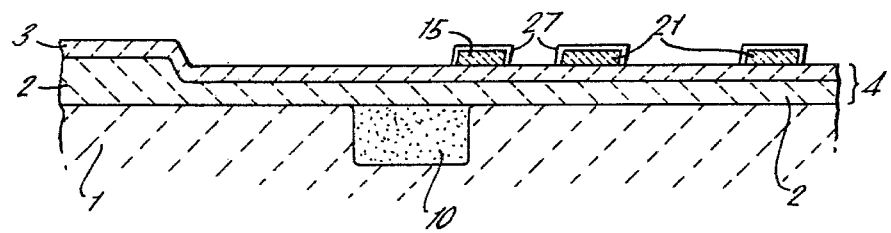
FIG. 4(c).
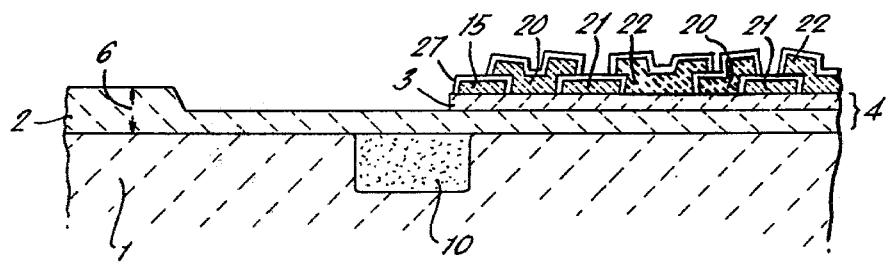
FIG. 4.

SEMICONDUCTOR CHARGE TRANSFER DEVICE WITH MULTI-LEVEL POLYSILICON ELECTRODE AND BUS-LINE STRUCTURE

This invention relates to semiconductor charge transfer devices.

The invention relates particularly to semiconductor charge transfer devices of the kind comprising: a semiconductor substrate; a channel region in the substrate; an electrode structure overlying the channel region which structure comprises a plurality of layers of polycrystalline silicon and provides a row of electrode elements extending along the channel region so that storge and transfer of electric charge within the channel region can be controlled by electric potentials applied to the electrode structure, the electrode elements of each layer of polycrystalline silicon being electrically interconnected by a respective polycrystalline silicon bus-line, the bus-lines extending along a side of the row of electrode elements, and a metal conductor pattern in contact with the bus-lines to provide a respective high conductivity path in parallel with and extending along each bus-line. Such a semiconductor charge transfer device is hereinafter referred to as a semiconductor device of the kind specified.

It will be appreciated that a semiconductor device of the kind specified will in practice also include means for introducing charge packets corresponding to an input signal into the device, and means for deriving an output signal corresponding to the charge packets after transfer along the device. It will be understood that the input signal is not necessarily electrical and may instead be optical.

In a semiconductor device of the kind specified due to unavoidable impurities or defects, pinholes are normally present in the polycrystalline silicon (hereinafter referred to as polysilicon). The presence of such a pinhole allows etchants used during fabrication to penetrate through to, and form a hole in, the insulating layer provided under each polysilicon layer where it overlies another polysilicon layer. Upon subsequent deposition of the metal conductor pattern deposited metal will penetrate through such a pinhole and the hole in the underlying insulating layer causing an interlayer short circuit between polysilicon layers. To avoid this difficulty it has been proposed that each high conductivity path should contact its associated bus-line only in regions where the bus-line does not overlap another layer of polysilicon. In practice this has been achieved by making the contacts to the upper bus-lines in the spaces between the electrode elements of the underlying polysilicon layer or layers. As a result the area available for the contacts between the high conductivity paths and the bus-lines is limited, particularly in respect of the uppermost polysilicon layer.

It is an object of the present invention to provide a semiconductor device of the kind specified wherein this problem is alleviated.

According to the present invention in a semi-conductor device of the kind specified at least one said high conductivity path contacts its associated bus-line within each of a plurality of regions of its associated bus-line which do not overlap any other polysilicon layer, said bus-lines are disposed in overlapping relationship, and said regions are defined by apertures in one or more of the other bus-lines which are so shaped and positioned that the number of said regions along said associated bus-line is less than the number of electrode elements connected with that bus-line and the width of each said region is greater than the width of the electrode elements.

Preferably adjacent apertures in the or each said other bus-line are at a spacing greater than the width of the electrode elements.

In one particular arrangement in accordance with the invention the apertures in the or each said other bus-line are regularly positioned at a pitch substantially twice that of the electrode elements connected by that bus-line.

The apertures are preferably of such shapes and positions that the or each said other bus-line is continuous along its edge from which the associated electrode elements project. In such an arrangement the apertures in the or each said other bus-line are preferably each wholly surrounded by polycrystalline silicon forming the bus-line.

One semiconductor charge transfer device in accordance with the invention and a method of fabricating it will now be described by way of example only, with reference to the accompanying drawings in which:

FIG. 4 illustrates schematically various stages in a method of fabricating the device.

Figure 1:
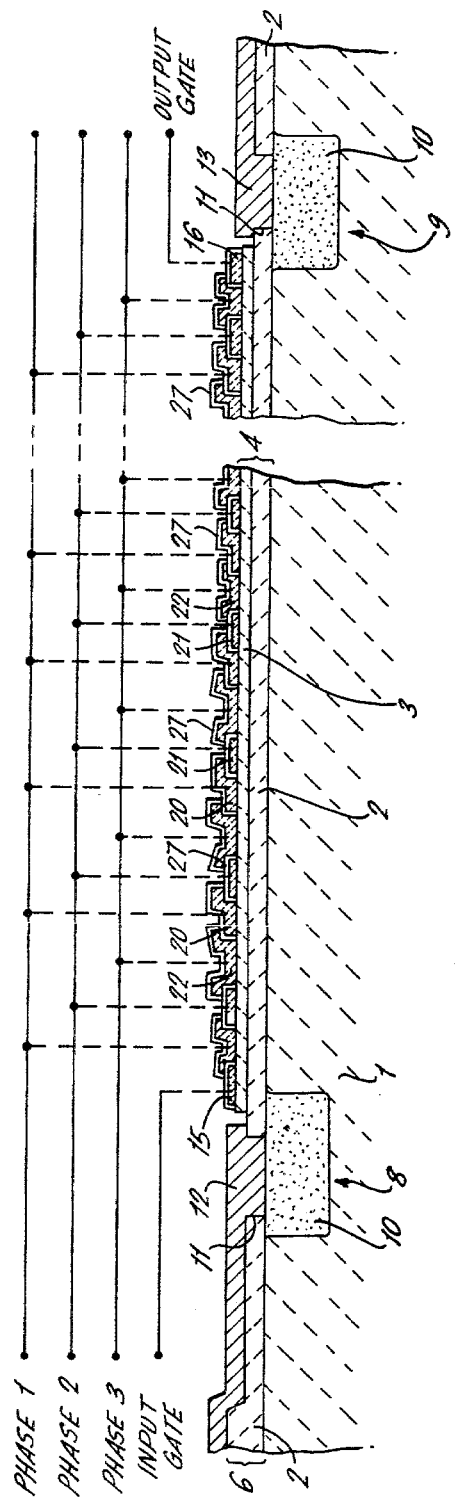
FIG. 1 shows diagrammatically a longitudinal section through the device.
Figure 2:
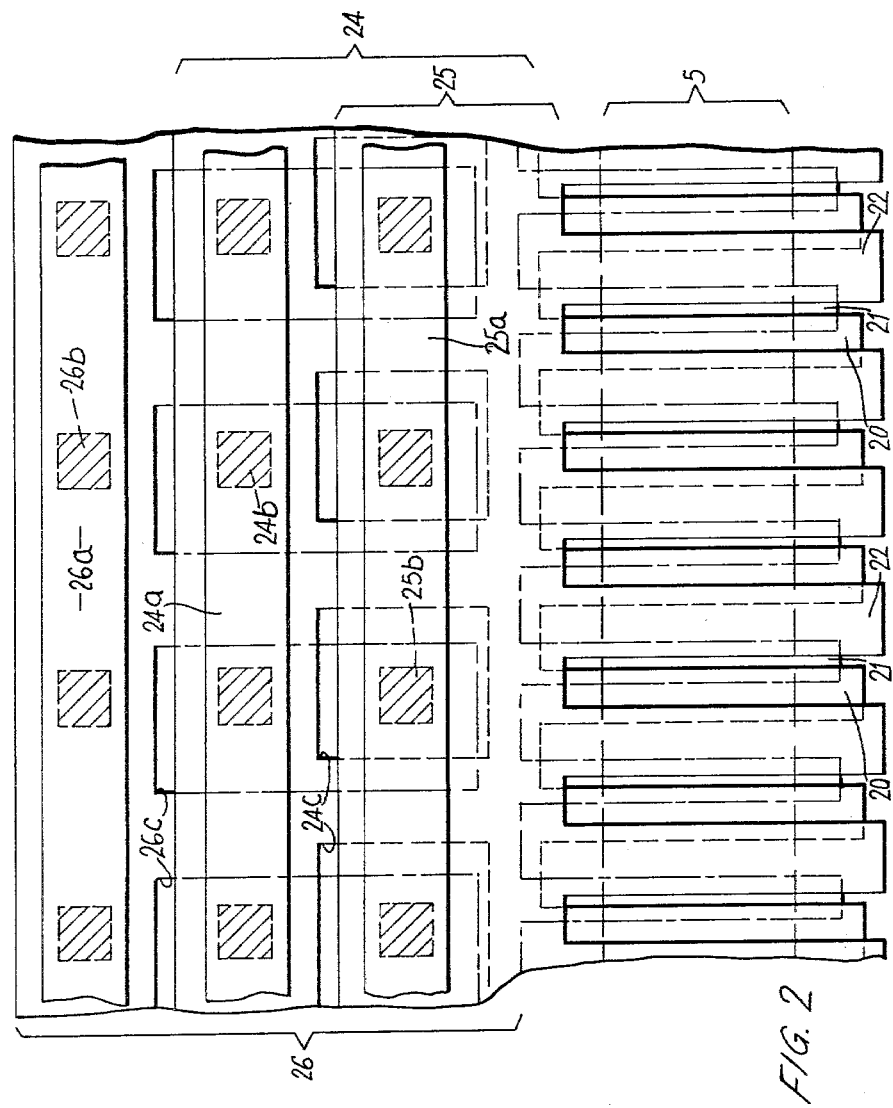
FIG. 2 shows diagrammatically a plan view of part of the device shown in FIG. 1.

Referring to FIGS. 1 and 2 of the drawings, the device comprises a p-type silicon semiconductor substrate 1 on the surface of which is a first insulating layer 2 of silicon dioxide partially covered by a second insulating layer 3 of silicon nitride. The insulating layers 2, 3 comprise a central gate insulation region 4 which overlies a charge transfer channel 5 (shown in dotted lines in FIG. 2) at the surface of the substrate 1, surrounded by a field insulation region 6 in which the silicon dioxide layer 2 is thicker than in the gate insulation region.

At opposite ends of the channel region 5 are a charge source and a charge drain in the form of an input diode 8 and output diode 9, each diode comprising an n-type diffusion 10 in the substrate 1 contacted through window 11 in the overlying insulation oxide layer 2 by a respective metal conductor 12, 13.

Overlying the insulation layers 2, 3 is a gate electrode structure comprising three mutually insulated levels of polysilicon. This electrode structure provides gate electrodes 15, 16 for controlling charge flowing from and to the input and output diodes 8, 9, respectively and a three-phase transfer gate electrode pattern. Each phase of the pattern comprises a bus-line 24, 25, 26 running parallel with the transfer channel 5 but overlying the field insulation region 6, and connecting in common a respective plurality of spaced parallel transfer gate electrodes 20, 22, 21 extending transversely across the channel region 5 above the gate insulation 4. The bus-lines 24, 25, 26 are positioned so as to extend along one side of the electrode structure 15, 16, 20, 21, 22 in overlapping relation.

Figure 3A:
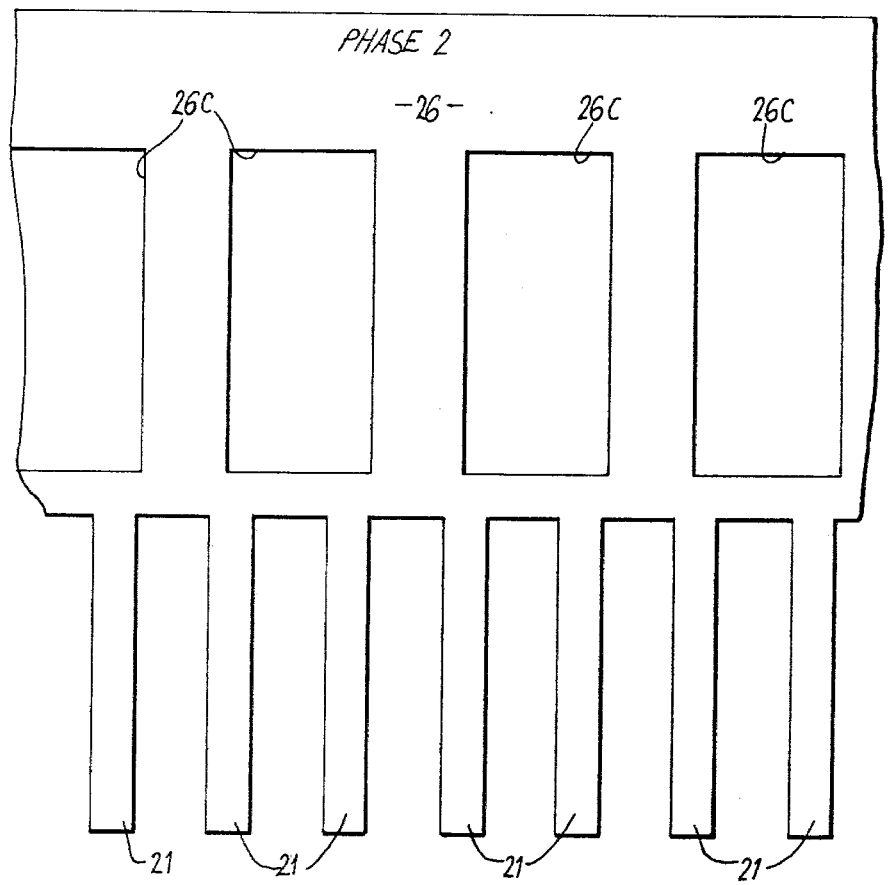
FIGS. 3a, 3b and 3c show diagrammatically respective plan views of three levels of polysilicon in the part of the device shown in FIG. 2.
Figure 3C:
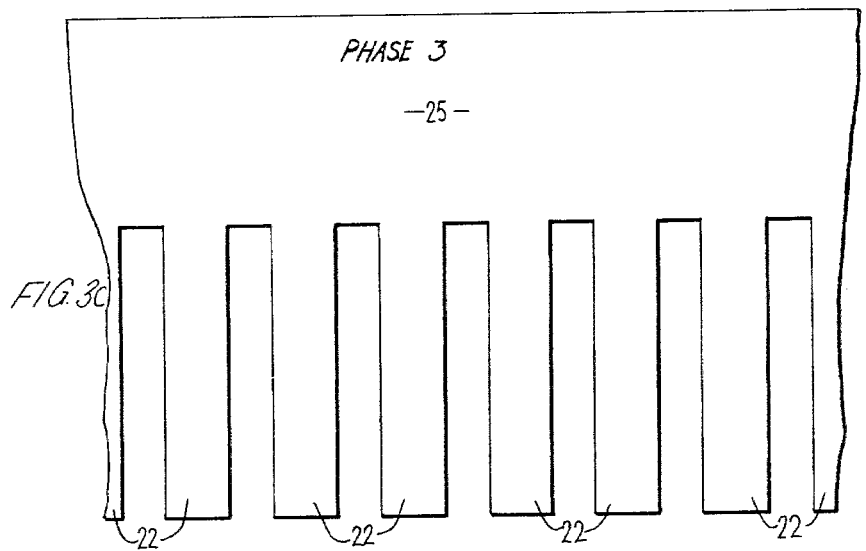
Figure 3B:
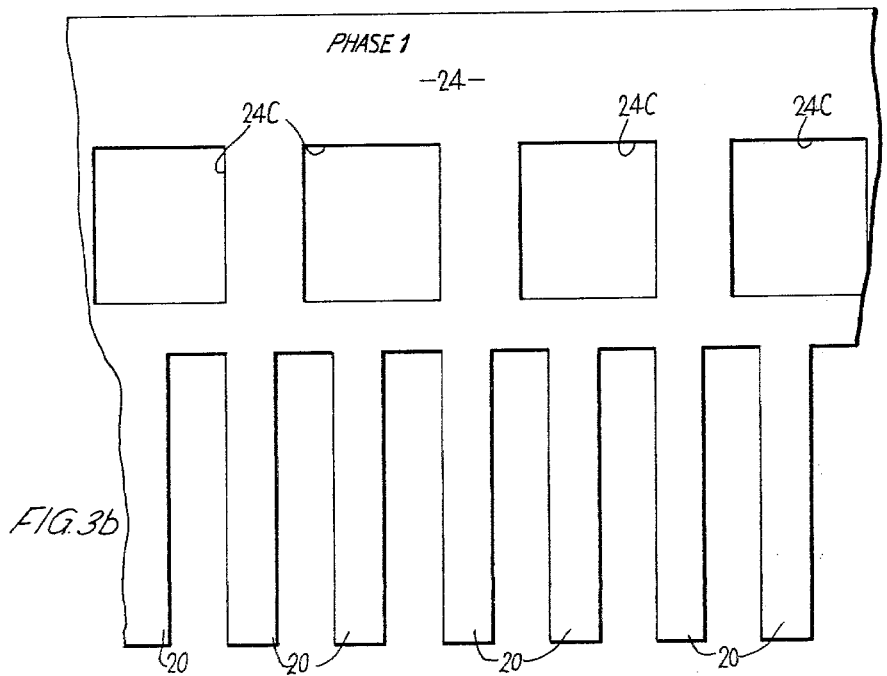

Plan views of the three levels of polysilicon along part of the channel region of the device are shown in FIGS. 3a, 3b and 3c respectively.

Each level of polysilicon is covered by its own layer of silicon dioxide 27 to provide mutual insulation between the phases and for protection. Associated with each polysilicon bus-line 24, 25, 26 is a respective high conductivity metal bus-line 24a, 25a, 26a, running in parallel with its associated polysilicon bus-line and in contact therewith through respective contact windows 24b, 25b, 26b in the insulating layers 27 of silicon dioxide. The metal bus-lines 24a, 25a, 26a are provided since the limited conductivity of the polysilicon bus-lines 24, 25, 26 would otherwise impair the performance of the device, particularly at high frequencies.

To avoid interlayer short circuits via pinholes, as described earlier, each metal bus-line 24a, 25a, 26a contacts its associated polysilicon bus-line 24, 25, 26 only in regions where the associated polysilicon bus-line does not overlap another layer of polysilicon.

Hence, as shown in FIG. 2, the metal bus-line 26a for the lowest level polysilicon bus-line 26 makes contact through contact windows 26b spaced along a region of the bus-line 26 which extends beyond and is thus not overlaid by either of the other two bus-lines 24 and 25, the windows 26b having a pitch twice that of the electrodes 21 interconnected by that bus-line 26.

In the case of the middle level polysilicon bus-line 24, the associated metal bus-line 24a make contact through similarly spaced contact windows 24b lying in regions of the bus-line 24 not overlaid by the bus-line 25 and defined by apertures 26c in the bus-line 26.

In the case of the uppermost level polysilicon bus-line 25, the associated metal bus-line 25a makes contact through similarly spaced contact windows 25b lying in regions defined by the apertures 26c in the bus-line 26 and further apertures 24c in the bus-line 24 which partly overlap the apertues 26c.

It will be appreciated that the number of contacts provided between each metal bus-line and its associated polysilicon bus-line may be chosen quite independently of the number of electrodes which that polysilicon bus-line interconnects. Thus the number of contacts may be chosen with a view to obtaining contacts of convenient width and spacing to facilitate fabrication. In the particular embodiment being described the contacts have a pitch twice that of the electrode elements and a width about twice the effective width of an electrode element. Whilst any desired width and spacing for the contacts may be chosen, the practical significance of the arrangement is that widths and spacings greater than those of the electrode elements may be provided for all the bus-lines, regardless of the number of bus-lines.

A method of a fabricating the 3-phase charge transfer device described above with reference to FIGS. 1, 2 and 3 will now be described, with reference also to FIG. 4 which illustrates various stages in the method. The vertical scale of FIG. 4 is distorted for clarity.

Referring first to FIG. 4(a), the n-type diffusion regions 10 (only one of which is shown) for the input and output diodes 8, 9 are formed in the p-type silicon substrate 1 using a thermally grown oxide mask produced in known manner by a well known photolithographic process. This oxide mask is then removed and the first insulation layer 2 of silion dioxide is thermally grown in two stages to have a thickness of 1000 Å over the central channel region 5 (FIG. 2), i.e. the gate insulation region 4, and elsewhere, i.e. the field insulation region 6, a thickness of 2000 Å.

The second insulating layer 3 of silicon nitride is then deposited to a thickness of 500 Å over the oxide insulating layer 2, followed by a 5000–7000 Å thick layer of polysilicon which is then doped with phosphorous to render it conductive. The nitride layer 3 acts as a barrier to the phosphorous dopant to prevent it from penetrating through the underlying oxide layer 2 to the substrate 1.

An oxide masking layer is then grown over the polysilicon and etched using standard photolithographic techniques into a mask pattern corresponding to the desired pattern of the phase two electrodes 21, the bus-line 26 and the input and output gates 15, 16 for the diodes 8, 9, and the device is then treated first with a polysilicon etchant to remove all exposed areas of polysilicon, and then with an oxide etchant to remove the masking oxide layer to leave only the required polysilicon electrode pattern on the surface of the nitride layer 3 (see FIG. 3a). A layer 27 of insulating silicon-dioxide 1000 Å thick is then grown on the electrode pattern as illustrated in FIG. 4(b).

This polysilicon deposition, etching and oxidation process is then repeated twice to produce the second and third levels of the electrode structure which provide the phase one and phase three transfer electrodes 20, 22 and their bus-lines 24, 25 (see FIGS. 3b and 3c).

As described above, the nitride layer 3 protects the underlying oxide insulation layer 2, which is particularly important in the region underlying the gate electrodes 20, 21, 22, from the oxide and polysilicon etchants used to form the polysilicon electrode structure, and to prevent additional growth of oxide on the layer 2 during the thermal growth of the oxide insulation coatings 27 on the polysilicon electrodes. This serves to maintain an even thickness of gate insulation between the gate electrodes 20, 21, 22 of each phase, or polysilicon level.

Having formed the oxide insulation coating 27 on the last polysilicon electrode pattern, the entire device is dipped in a nitride etchant, e.g. orthophosphoric acid, to remove all exposed areas of the nitride layer 3 as shown in FIG. 4(c) using the existing electrode structure as a mask.

A photoresist contact window mask is then formed on the upper surface of the device having apertures therein corresponding to the diode contact windows 11, contact windows 19 to the input and output gates 15, 16, and the contact windows 24b, 25b, 26b to the polysilicon bus-lines 24, 25, 26 respectively. The device is then treated in an oxide etchant bath for a period sufficient only to etch through the 1000 Å thickness of the respective gate oxide layer 2 and coatings 27, to form the said contact windiws, and the photoresist mask is removed.

A layer of aluminium is then deposited over the upper surface of the device and photolithographically etched to form a conductor pattern providing lead-in conductors 18 and 12 to the input and output gates 15, 16 and the input and output diodes 8, 9, respectively, and the bus-lins 24a, 25a, 26a for the three phases of the polysilicon electrode structure.

The metal conductor pattern may then be sintered, after which the device is subjected to an annealing process to remove harmful surface states at the boundary between the gate insulation oxide 2 and the substrate 1 and the channel region 5. The annealing process comprises subjecting the device to forming gas, a mixture of hydrogen and nitrogen, at a temperature of 435° C. In this respect the width of the nitride layer overlying the channel region is important as, if it is too wide i.e. greater than 200 microns, it inhibits the penetration of the forming gas to the whole of the channel region 5.

In a modification of the above method, instead of relying on the presence of the electrode structure to act as a mask for the nitride etchant a separate mask of vapour deposited silicon dioxide may be formed before the formation of the oxide coating 27 on the third polysilicon electrode pattern. This mask may be formed with windows exposing the nitride layer 3 over the source and drain regins 10 only, or it may simply cover the existing electrode structure so as to expose wall areas of the nitride layer 3 surrounding the electrode structure.

The areas of the nitride layer 3 exposed by the vapour deposited silicon dioxide mask are then etched away, the mask removed, and the oxide coating 27 then formed on the third polysilicon electrode pattern. The fabrication method is then completed as before with the formation of all the contact windows and the deposition of the metal conductor pattern.

The use of a vapour deposited mask is not necessary, but is preferred since it reduces the possiblility of short circuits to substrate forming through "pinholes" in the polysilicon electrode structure covered by the mask.

It is pointed out that whilst in the particular device described above the apertures 24c and 26c are wholly surrounded by polycrystalline silicon, this is not necessarily the case. Thus in other devices in accordance with the invention open ended apertures which extend to an edge of the polycrystalline silicon bus-line in which they are formed might be provided. However, in general, such arrangements are less satisfactory since the overall resistance of the bus-lines is increased, particularly if the apertures extend to the edge from which the electrode elements project.

It is further pointed out that whilst in the particular device described above the apertures required to provide the contact regions in the bus-line are formed in the underlying polysilicon layers, in other arrangements apertures in overlying polysilicon layers might be formed to provide a contact region in an underlying bus-line.

I claim:

1. A semiconductor charge transfer device comprising: a semiconductor substrate; a channel region in the substrate; an electrode structure overlying the channel region which structure comprises a plurality of layers of polycrystalline silicon and provides a row of electrode elements extending along the channel region so that storage and transfer of electric charge within the channel region can be controlled by electric potentials applied to the electrode structure, the electrode elements of each layer of polycrystalline silicon being electrically interconnected by a respective polycrystalline silicon bus-line, the bus-lines extending along a side of the row of electrode elements; and a metal conductor pattern in contact with the bus-lines to provide a respective high conductivity path in parallel with and extending along each bus-line, at least one said high conductivity path contacting its associated bus-line within each of a plurality of regions of its associated bus-line which do not overlap any other polysilicon layer; and the device including the improvement that said bus-lines are disposed in overlapping relationship, and said regions are defined by apertures in one or more of the other bus-lines which are so shaped and positioned that the number of said regions along said associated bus-line is less than the number of electrode elements connected with that bus-line and the width of each said region is greater than the width of the electrode elements.

2. A semiconductor device according to claim 1 wherein adjacent apertures in the or each said other bus-line are at a spacing greater than the width of the electrode elements connected by that other bus-line.

3. A semiconductor device according to claim 2 wherein the apertures in the or each said other bus-line are regularly positioned at a pitch substantially twice that of the electrode elements connected by that other bus-line.

4. A semiconductor device according to claim 1 wherein said apertures are of such shapes and positions that the or each said other bus-line is continuous along its edge from which the associated electrode elements project.

5. A semiconductor device according to claim 4 wherein the apertures in the or each said other bus-line are each wholly surrounded by polycrystalline silicon forming that other bus-line.

6. A semiconductor device according to claim 1 wherein said regions of said associated bus-line are defined by apertures in the or each underlying other bus-line.

7. A semiconductor device according to claim 6 having three said layers of polycrystalline silicon, the lowermost layer bus-line being contacted by its associated high conductivity path in a region where that bus-line extends beyond the other two bus-lines, and the other two bus-lines being contacted by their associated high conductivity paths in regions defined by apertures in the or each underlying bus-line.

* * * * *